United States Patent
Hyvärinen et al.

(10) Patent No.: US 7,729,148 B2
(45) Date of Patent: Jun. 1, 2010

(54) METHOD FOR THERMAL PROTECTION OF FREQUENCY CONVERTER AND A FREQUENCY CONVERTER

(75) Inventors: Ari Hyvärinen, Helsinki (FI); Antti Tarkiainen, Järvenpää (FI); Johanna Laukkanen, Rajamäki (FI)

(73) Assignee: ABB Oy, Helsinki (FI)

( * ) Notice: Subject to any disclaimer, the term of this patent is extended or adjusted under 35 U.S.C. 154(b) by 232 days.

(21) Appl. No.: 11/987,104

(22) Filed: Nov. 27, 2007

(65) Prior Publication Data
US 2008/0316777 A1    Dec. 25, 2008

(51) Int. Cl.
*H02M 5/293*   (2006.01)
*H02H 7/122*   (2006.01)

(52) U.S. Cl. .................. 363/163; 363/50; 363/165; 361/93.8

(58) Field of Classification Search .......... 363/50, 363/55, 56.02, 132, 157, 159, 163, 165; 318/471, 318/783; 361/93.8; 324/670, 721, 760
See application file for complete search history.

(56) References Cited

U.S. PATENT DOCUMENTS

| | | | |
|---|---|---|---|
| 4,980,624 A | 12/1990 | Bernhardt | |
| 5,057,962 A * | 10/1991 | Alley et al. | .......... 361/24 |
| 5,923,135 A | 7/1999 | Takeda | |
| 7,035,064 B2 * | 4/2006 | Schimanek et al. | .......... 361/23 |
| 2005/0071090 A1 | 3/2005 | Katou | |

FOREIGN PATENT DOCUMENTS

| | | |
|---|---|---|
| EP | 0 961 379 A2 | 12/1999 |
| JP | 07-255166 A | 10/1995 |
| JP | 2000-228882 A | 8/2000 |

OTHER PUBLICATIONS

European Search Report dated May 8, 2007.

* cited by examiner

*Primary Examiner*—Gary L Laxton
(74) *Attorney, Agent, or Firm*—Buchanan Ingersoll & Rooney PC (57) ABSTRACT

A method for thermal protection of a frequency converter and a frequency converter includes means for controlling the output current of the frequency converter. The method includes the steps of determining predetermined data points which define a thermal current limit for a semiconductor component of the frequency converter at specific temperatures at plural switching frequencies, and determining predetermined data points which define a thermal current limit for the semiconductor component at specific temperatures at a zero converter output frequency. The method also includes determining the highest allowable thermal current as a function of a measured temperature, a determined switching frequency, and a determined output frequency based on the defined data points, and limiting the output current of the frequency converter to the determined highest allowable thermal current.

15 Claims, 6 Drawing Sheets

METHOD FOR THERMAL PROTECTION OF FREQUENCY CONVERTER AND A FREQUENCY CONVERTER

RELATED APPLICATIONS

This application claims priority under 35 U.S.C. §119 to EP Application 06124807.6 filed in Europe on Nov. 27, 2006, the entire contents of which are hereby incorporated by reference in their entireties.

TECHNICAL FIELD

The present disclosure relates to a method for thermal protection of a frequency converter and to a frequency converter, and particularly to a method with which the frequency converter can be protected against excessive heating by limiting the output current of the converter.

BACKGROUND INFORMATION

Due to material technology, the highest allowable temperature of the pn-junction of a power semiconductor component is fixed. This temperature cannot be exceeded without risking the reliable operation of the component. The junction temperature is affected by ambient temperature and also by the magnitude of losses in the semiconductor. The losses in the semiconductor component can be divided into conduction losses and switching losses, both of which are dependent on the current flowing through the component. The magnitude of switching losses is greatly dependent on the switching frequency and on the voltage over the component when in blocking state. The losses in the semiconductor component can be reduced by reducing the current flowing through it. For this reason it is possible to limit the junction temperature of the semiconductor component to a desired level by limiting the current flowing through it to suitable level.

One straightforward method for protecting power semiconductors is to define a current limit that is either fixed or possibly dependent on the switching frequency that prevents the excessive heating of the power semiconductors. A drawback of this method is that it does not take into account the temperature of the semiconductor module and thus also limits the current in the situation where the temperature of the module is low. Further, the above method does not take into account the output frequency, which leads to deficient protection at low output frequencies or alternatively to an unnecessarily low current limit at the higher output frequencies.

An advanced solution is to estimate the junction temperature using thermal resistances and thermal capacitances in a thermal model of a power semiconductor component. Estimated losses in the component are the inputs to the thermal model. Document R. Schnell, U. Schlapbach (ABB Switzerland Ltd., Semiconductors), "Realistic benchmarking of IGBT-modules with help of a fast and easy to use simulation-tool," proc. PCIM'04, 2004, shows that so called Zach equations can be used to estimate the losses needed for the thermal model. Zach equations can be used in the estimation of conduction losses of IGBTs and diodes when the converter is operating with a known modulation index and known output current. Switching losses can be estimated from data relating to switching loss energies given by the component manufacturer.

The losses of an IGBT bridge can be estimated with even more precise methods than the above-mentioned Zach equations. The switching losses of an IGBT bridge of a frequency converter can be estimated for example by calculating state changes, i.e. switchings of separate IGB transistors, and by determining switching loss powers relating to the switchings from the data provided by the component manufacturer. The conduction losses can be estimated by determining continuously which one of the semiconductor components, i.e. diode or IGBT, is in the conducting state, and by using a suitable conduction state loss model for the conducting component.

The above method includes the use of a thermal model which tries to depict the junction temperature of the semiconductor. When the junction temperature raises high enough, the output current and/or switching frequency of the converter must be limited. The above method includes the following three clearly distinct entities:
1. Loss model for the determination of losses
2. Thermal model for the calculation of the junction temperature
3. Logic for lowering the output current and/or switching frequency depending on the calculated junction temperature All the above entities are implemented in the control circuitry of the frequency converter and must be processed in real-time during the operation of the frequency converter. This leads to a relatively complex procedure for the protection of power semiconductors.

U.S. Pat. No. 4,980,624 discloses a method for thermal protection of a motor converter and of a motor. In this method the loading of the converter and motor is determined using motor current. Further, in the determination of the loading of the converter, the switching frequency is taken into account and in the determination of the loading of the motor, the output frequency is taken into account. The purpose of the method of U.S. Pat. No. 4,980,624 is to identify an overload situation and to trip the drive.

Document JP2000228882 A discloses a protection method for a frequency converter, which method tries to estimate the highest junction temperature of a power semiconductor. In this estimation the magnitude of the output current, switching frequency, output frequency, measured temperature and parameters depicting the dynamic temperature behavior of the parts of the converter are used in the estimation of junction temperature. In this method the junction temperature is estimated in real-time during the operation of the frequency converter.

One of the disadvantages associated with the above methods is the use of a thermal model that needs to be calculated during the operation of the frequency converter. These models are relatively complex and require high processor capacity.

SUMMARY

An object of the present disclosure is to provide a method and device so as to solve the above problems and to provide a simple method with which the semiconductor components of the frequency converter can be protected from overheating.

The disclosure is based on the idea of using pre-calculated data which depict the junction temperature of the semiconductor component as a function of the measured temperature $T_{sink}$ of the semiconductor module, switching frequency $f_{sw}$ and output frequency $f_{out}$, $$I_{th} = f(T_{sink}, f_{sw}, f_{out}) \quad (1)$$

This function defines a thermal current limit $I_{th}$, which gives a value for an allowable output current at the operation point in question. Function (1) is defined beforehand in such a way that at the operation point defined by the arguments of the function, the junction temperature of the semiconductor reaches the highest allowable value when the output current is $I_{th}$. If the output current of the frequency converter is limited to the value given by equation (1), the highest allowable junction temperature of the semiconductor component is not exceeded.

An exemplary method as disclosed does not require any thermal model that needs to be calculated and it is thus simpler and more straightforward than known methods. Equation (1) does not include any dynamics. However, the measured temperature $T_{sink}$ represents the temperature of the semiconductor module and a possible heat sink attached to it. These comprise dynamics that can be defined using a temperature time constant. The method does not, however, need to model the dynamics since it is taken into account directly through the temperature measurement.

BRIEF DESCRIPTION OF THE DRAWINGS

In the following the invention will be described in greater detail by means of exemplary embodiments with reference to the accompanying drawings, in which.

DETAILED DESCRIPTION

Figure 1:
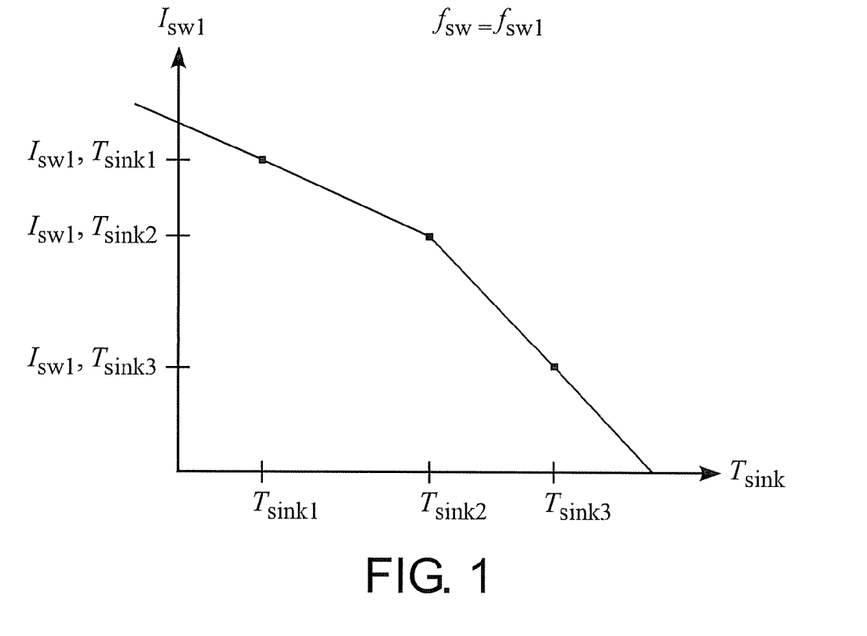
FIG. 1 shows an example of a thermal current limit as a function of temperature at a given switching frequency.

The protection method according to the present disclosure is based on beforehand determined curves or, more precisely, on calculated or measured distinct data points which are used in determining the allowable output current at any given operation point. These, data points can be approximated by curves which can be for example like the one shown in FIG. 1. The curve in FIG. 1 shows a thermal current limit $I_{sw1}$ as a function of the measured temperature in a specific switching frequency $f_{sw1}$. The curve of FIG. 1 is defined by three points $(T_{sink1}, I_{sw1,T_{sink1}})$, $(T_{sink2}, I_{sw1,T_{sink2}})$ and $(T_{sink3}, I_{sw1,T_{sink3}})$ which are determined beforehand and are parameters of the method.

The allowable thermal current $I_{sw1}$ corresponding to the measured temperature $T_{sink}$ and switching frequency $f_{sw1}$ can be determined by interpolation in the following way:

$$\text{if } T_{sink} \leq T_{sink2}: I_{sw1} = \tag{2}$$
$$I_{sw1,T_{sink1}} + (I_{sw1,T_{sink2}} - I_{sw1,T_{sink1}}) \cdot \frac{T_{sink} - T_{sink1}}{T_{sink2} - T_{sink1}}$$

$$\text{if } T_{sink} > T_{sink2}: I_{sw1} = \tag{3}$$
$$I_{sw1,T_{sink2}} + (I_{sw1,T_{sink3}} - I_{sw1,T_{sink2}}) \cdot \frac{T_{sink} - T_{sink2}}{T_{sink3} - T_{sink2}}.$$

The above linear interpolation yields the curve shown in FIG. 1. Instead of linear interpolation, other interpolation methods can be used. Further, the curve can be defined with two data points or with more than the shown three points. It should be noted that if the measured temperature $T_{sink}$ is lower than $T_{sink1}$ or higher than $T_{sink3}$, the equations (2) and (3) extrapolate the value of the function based on the given parameters. In the specification, extrapolation and interpolation are treated in the same way, and the estimation of a value of a function using interpolants is referred to as interpolation.

The measured temperature $T_{sink}$ can be the temperature of the semiconductor component or of any body that is thermally coupled to the semiconductor component.

The thermal current limits depict the absolute value on output current, and thus it cannot get negative values.

Curves similar to that of FIG. 1 are determined for different switching frequencies. This means that similar data points are determined at different switching frequencies, and with these data points curves can be drawn. There might be for example three different switching frequencies $f_{sw1}$, $f_{sw2}$ and $f_{sw3}$ at which this data is determined, thus leading to three curves. In practice these switching frequencies can be for example $f_{sw1}=2$ kHz, $f_{sw2}=8$ kHz and $f_{sw3}=16$ kHz. To get the graphical illustration, the data points at each different switching frequency are interpolated as in the equations (2) and (3). The allowable thermal currents are $I_{sw1}$, $I_{sw2}$ and $I_{sw3}$ which correspond to the switching frequencies $f_{sw1}$, $f_{sw2}$ and $f_{sw3}$ at the measured temperature $T_{sink}$. It is to be understood, that the curves shown in the figures are only a graphical presentation showing the results of interpolations and intended for a better understanding of the disclosure. Thus, the method itself does not require any graphs to be drawn.

Figure 2:
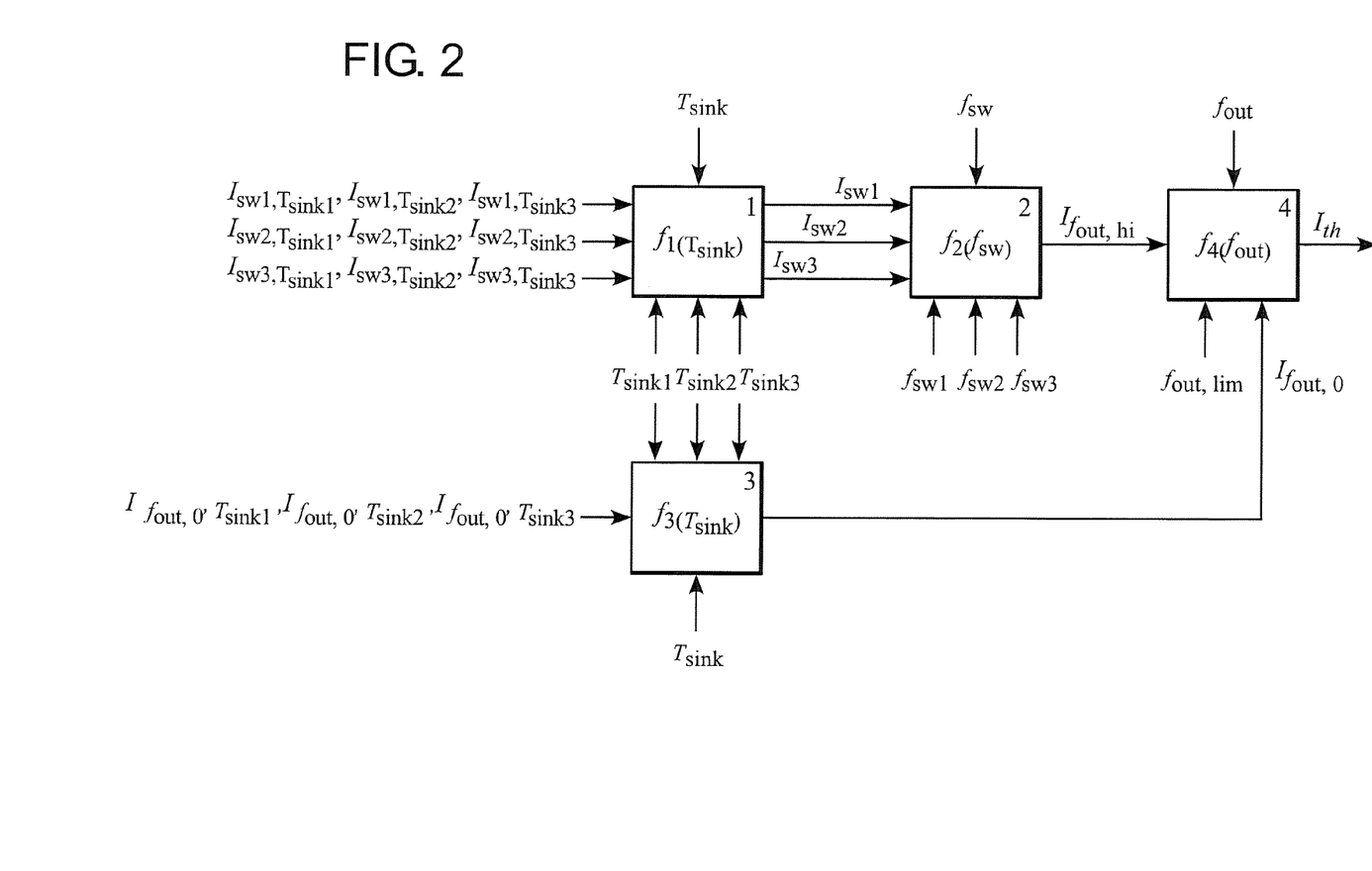
FIG. 2 shows a block diagram of an exemplary method of the disclosure.

The exemplary method of the disclosure is shown as a block diagram in FIG. 2. In FIG. 2 the interpolations corresponding to equations (2) and (3) for different switching frequencies are situated in block 1.

In the exemplary method, the output frequencies are divided into higher output frequencies and lower output frequencies. This is done by defining a limit frequency $f_{out,lim}$ and comparing the output frequency with this limit. If the output frequency $f_{out}$ is higher than the limit $f_{out,lim}$, then the output frequency is considered to be high. If, on the other hand the output frequency is lower than or equal to the limit frequency, then the output frequency is considered to be low. In practice the limit $f_{out,lim}$ can be for example 5 Hz. The output frequency in the method should be considered a physical frequency that does not take into account the direction of rotation and thus cannot get negative values.

Block 2 of FIG. 2 interpolates the allowable thermal current $I_{f_{out,hi}}$ at high output frequencies ($f_{out} > f_{out,lim}$) This interpolated current $I_{f_{out,hi}}$ corresponds to the used switching frequency $f_{sw}$. Block 2 thus carries out the following interpolation $$\text{if } f_{sw} \leq f_{sw2}: I_{f_{out,hi}} = I_{sw1} + (I_{sw2} - I_{sw1}) \cdot \frac{f_{sw} - f_{sw1}}{f_{sw2} - f_{sw1}} \tag{4}$$

$$\text{if } f_{sw} > f_{sw2}: I_{f_{out,hi}} = I_{sw2} + (I_{sw3} - I_{sw2}) \cdot \frac{f_{sw} - f_{sw2}}{f_{sw3} - f_{sw2}} \tag{5}$$

At high output frequencies, the highest allowable thermal current is $I_{f_{out,hi}}$. At low output frequencies ($f_{out} \leq f_{out,lim}$), the highest allowable thermal current is reduced in block 4 of FIG. 2. The reduction of the highest allowable thermal current is carried out using a similar curve as shown in FIG. 1, which depicts the highest allowable thermal current as a function of measured temperature when the output frequency is 0 Hz. These so called zero frequency curves need not be determined for different switching frequencies. This is due to the fact that at low output frequencies the actual switching frequency of the frequency converter does not depend that much on the switching frequency reference. However, it is not excluded from the disclosure to use multiple zero frequency curves that correspond to different switching frequencies.

The zero frequency curve can be defined with three points $(T_{sink1}, I_{f_{out,0},T_{sink1}})$, $(T_{sink2}, I_{f_{out,0},T_{sink2}})$ and $(T_{sink3}, I_{f_{out,0},T_{sink3}})$ for example. In FIG. 2 block 3 interpolates the allowed thermal current $I_{f_{out,0}}$ at the zero frequency based on the measured temperature in the following way:

$$\text{if } T_{sink} \leq T_{sink2}: I_{f_{out,0}} = \quad (6)$$

$$I_{f_{out,0},T_{sink1}} + \left(I_{f_{out,0},T_{sink2}} - I_{f_{out,0},T_{sink1}}\right) \cdot \frac{T_{sink} - T_{sink1}}{T_{sink2} - T_{sink1}}$$

$$\text{if } T_{sink} > T_{sink2}: I_{f_{out,0}} = \quad (7)$$

$$I_{f_{out,0},T_{sink2}} + \left(I_{f_{out,0},T_{sink3}} - I_{f_{out,0},T_{sink2}}\right) \cdot \frac{T_{sink} - T_{sink2}}{T_{sink3} - T_{sink2}}.$$

Block 4 of FIG. 2 takes into account the output frequency $f_{out}$ and interpolates the highest allowable thermal current $I_{th}$ in the following way:

$$\text{if } f_{out} \leq f_{out,lim}: I_{th} = I_{f_{out,0}} + \left(I_{f_{out,hi}} - I_{f_{out,0}}\right) \cdot \frac{f_{out}}{f_{out,lim}} \quad (8)$$

$$\text{if } f_{out} > f_{out,lim}: I_{th} = I_{f_{out,hi}}. \quad (9)$$

If the output frequency lies between $0 \leq f_{out} \leq f_{out,lim}$, then block 4 interpolates the allowed thermal current between the thermal current of high output frequencies and zero output frequency thermal current. If the output frequency is higher than the frequency limit, $f_{out} > f_{out,lim}$ interpolation is not carried out, but the highest allowable thermal current determined for high output frequencies is used.

The highest allowable thermal current $I_{th}$ determined by the protection method is fed to the control circuitry controlling the operation of the frequency converter. If needed, the control circuitry limits the output current of the converter such that the magnitude of the output current does not exceed the highest allowable thermal current $I_{th}$.

Figure 3:
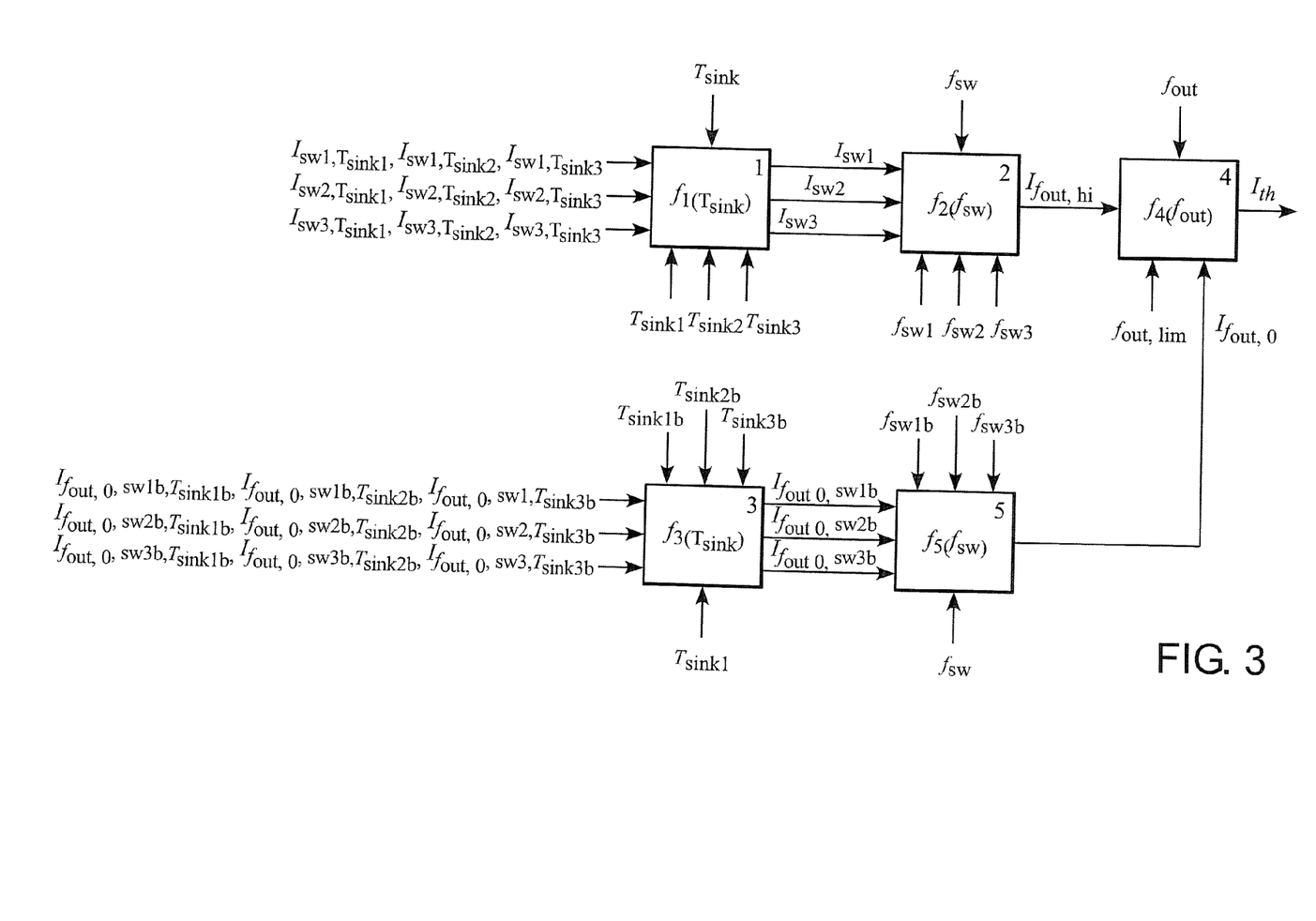
FIGS. 3, 4 and 5 show block diagrams of exemplary embodiments of the disclosure.

According to one exemplary embodiment of the disclosure, multiple curves for a zero output frequency are calculated using different switching frequencies. FIG. 3 shows a block diagram of such an embodiment. In FIG. 3 a zero output frequency curve is defined by three data points $(T_{sink1b}, I_{f_{out,0},sw1b,T_{sink1b}})$, $(T_{sink2b}, I_{f_{out,0},sw1b,T_{sink2b}})$ and $(T_{sink3b}, I_{f_{out,0},sw1b,T_{sink3b}})$. Corresponding curves are defined for three different switching frequencies $f_{sw1b}$, $f_{sw2b}$ and $f_{sw3b}$. These curves, or sets of data points, are fed to block 3 of FIG. 3. Block 3 interpolates the highest allowable thermal currents $I_{f_{out,0},sw1b}$, $I_{f_{out,0},sw2b}$ and $I_{f_{out,0},sw3b}$ at the zero output frequency at the switching frequencies $f_{sw1b}$, $f_{sw2b}$ and $f_{sw3b}$ corresponding to the measured temperature $T_{sink}$. In case of the switching frequency $f_{sw1b}$, the interpolation can be carried out in the following way:

$$\text{if } T_{sink} \leq T_{sink2b}: I_{f_{out,0},sw1b} = I_{f_{out,0},sw1b,T_{sink1b}} + \quad (10)$$

$$\left(I_{f_{out,0},sw1b,T_{sink2b}} - I_{f_{out,0},sw1b,T_{sink1b}}\right) \cdot \frac{T_{sink} - T_{sink1b}}{T_{sink2b} - T_{sink1b}}$$

$$\text{if } T_{sink} > T_{sink2b}: I_{f_{out,0},sw1b} = I_{f_{out,0},sw1b,T_{sink2b}} + \quad (11)$$

$$\left(I_{f_{out,0},sw1b,T_{sink3b}} - I_{f_{out,0},sw1b,T_{sink2b}}\right) \cdot \frac{T_{sink} - T_{sink2b}}{T_{sink3b} - T_{sink2b}}.$$

The curve for a zero output current can be defined by two points or by more than three points. Correspondingly, the number of zero output frequency curves, i.e. the number of switching frequencies used for the determination of data points, need not be three, but can be some other number as well. Further, the temperatures, such as $T_{sink1b}$, $T_{sink2b}$ and $T_{sink3b}$ used in defining the zero output frequency curves, need not be the same as the temperatures $T_{sink1}$, $T_{sink2}$ and $T_{sink3}$ used in block 1 of FIG. 3. Even further, the switching frequencies in block 5 of FIG. 3 can differ from the switching frequencies used in connection with the block 2.

Block 5 of FIG. 3 interpolates the allowable thermal current $I_{f_{out,0}}$ corresponding to the used switching frequency $f_{sw}$ by using the zero output frequency thermal currents $I_{f_{out,0},sw1b}$, $I_{f_{out,0},sw2b}$ and $I_{f_{out,0},sw3b}$ corresponding to different switching frequencies in the following way:

$$\text{if } f_{sw} \leq f_{sw2b}: I_{f_{out,0}} = I_{sw1b} + (I_{sw2b} - I_{sw1b}) \cdot \frac{f_{sw} - f_{sw1b}}{f_{sw2b} - f_{sw1b}} \quad (12)$$

$$\text{if } f_{sw} > f_{sw2b}: I_{f_{out,0}} = I_{sw2b} + (I_{sw3b} - I_{sw2b}) \cdot \frac{f_{sw} - f_{sw2b}}{f_{sw3b} - f_{sw2b}}. \quad (13)$$

The allowed thermal current for the zero output frequency is fed to block 4, the operation of which is described above with reference to FIG. 2.

Figure 4:
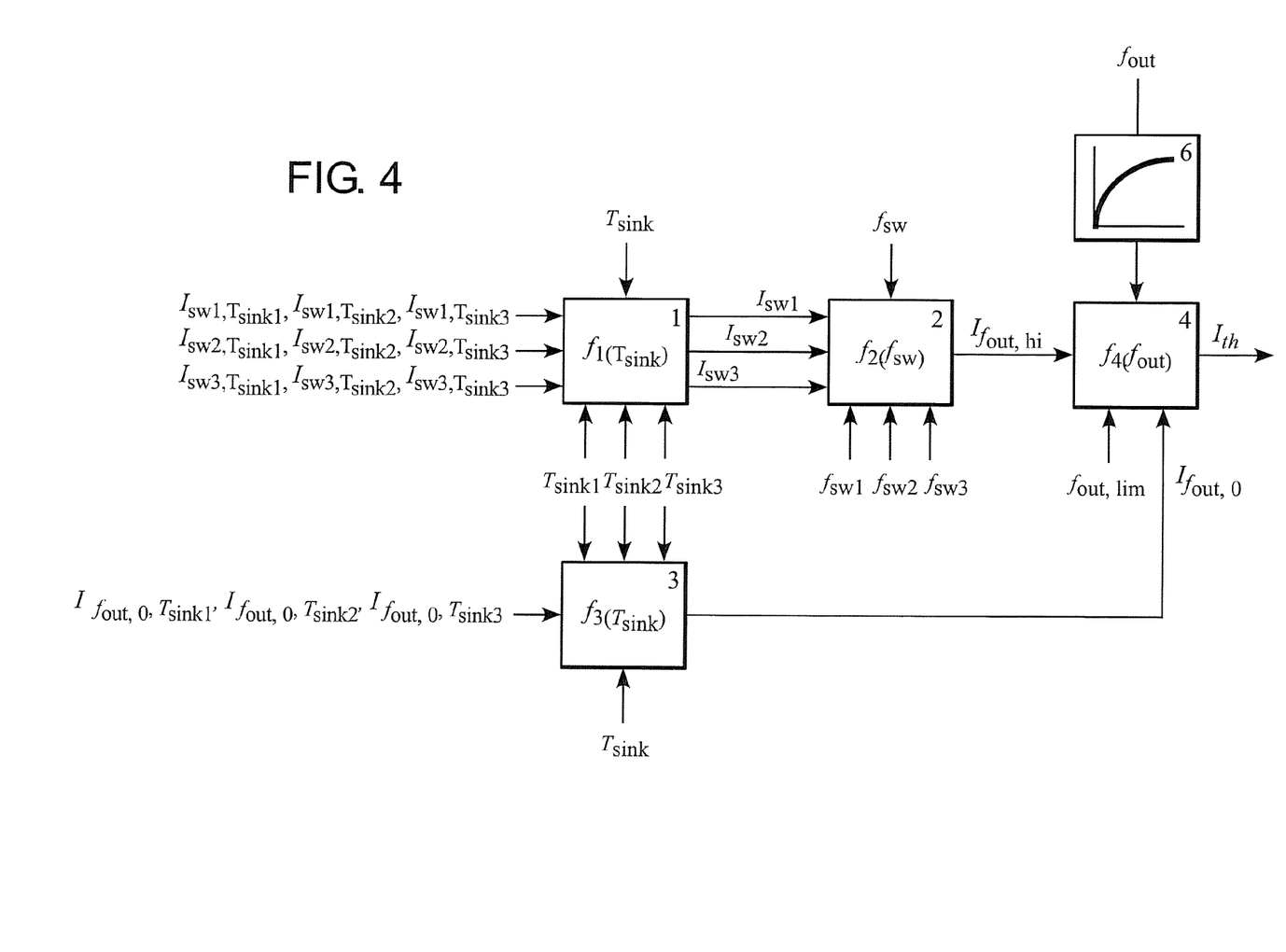

The output frequency used in the disclosed method of the can be an instantaneous output frequency. According to one exemplary embodiment of the disclosure the output frequency used in the method is a filtered value of the actual output frequency. In FIG. 4, block 6 low-pass filters the instantaneous output frequency before it is used in block 4. With low-pass filtering an unnecessary reduction of output current can be avoided in some cases, such as in fast reversals, where the output frequency of the frequency converter is instantaneously zero.

It has been found that when the frequency converter feeds power to the motor, the power semiconductors of the converter are loaded in a different manner when compared to a situation where the motor is in the regenerative mode. When in the motoring mode, i.e. the converter feeds power to the load, the losses in the IGBT components of the converter are typically higher than at the same operation point when in the regenerative mode. Diodes, on the other hand, act in the opposite way with regard to the losses. Typically, the losses of the IGBT components in the motoring mode are higher than the losses of the diodes at a similar operation point in the regenerative mode. It cannot be directly determined, however, whether the load capacity of an IGBT module higher in the motoring mode or in the regenerative mode since the components have different cooling properties. If the IGBT module is such that its thermal load capacity is considerably higher in the regenerative mode than in the motoring mode, the capacity in the regenerative mode is not fully utilized if the current limitation is carried out on the basis of the motoring mode load capacity.

In the present method, the differing load capacities can be taken into account by multiplying the determined thermal current $I_{th}$ with a factor k, the value of which depends on the mode of the frequency converter, i.e. whether the converter is in the motoring mode or in the regenerative mode. This way the control circuitry of the frequency converter limits the output current to a value $kI_{th}$. For example, if the thermal loading capacity of the IGBT module was higher in the regenerative mode than in the motoring mode, the factor k might get a value 1 in the regenerative mode and value 0.8 in the motoring mode. The control circuitry of the frequency converter determines whether the frequency converter is in the regenerative mode or in the motoring mode.

Figure 5:
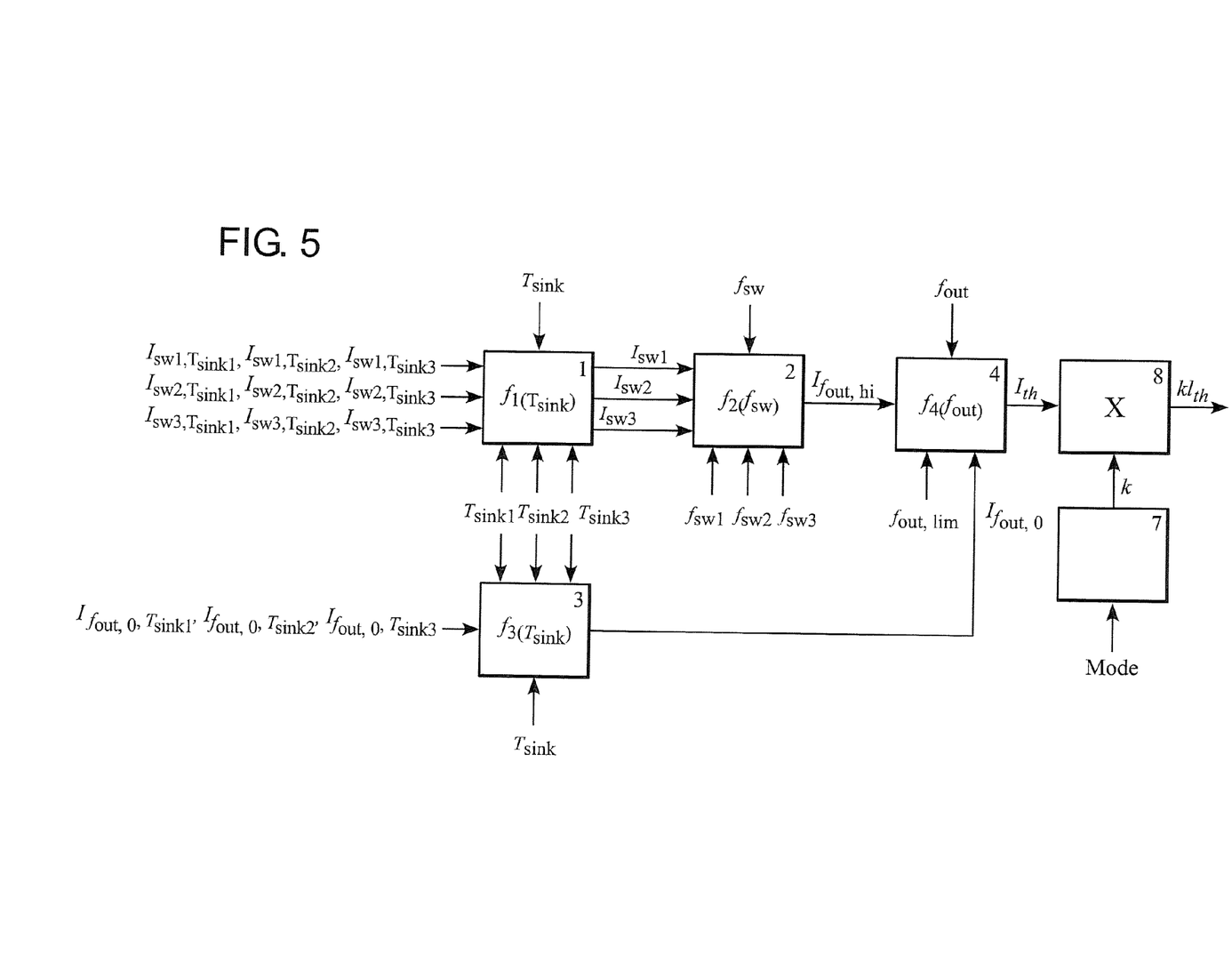

In the block diagram of FIG. 5, block 7 receives a signal "Mode" indicating whether the frequency converter is in the motoring or regenerative mode. Block 7 selects a value for factor k depending on the "Mode" signal and block 8 multiplies the signal $I_{th}$ with the factor k. Signal $kI_{th}$ represents the highest allowable thermal current and the control circuitry limits the output current to this value.

In yet another exemplary embodiment of the disclosure, block 2 of FIG. 2 does not carry out extrapolation to determine the allowable thermal current at high output frequencies $I_{f_{out,hi}}$, if the used switching frequency is lower than the lowest switching frequency fed as a parameter. This means that the allowable thermal current at high output frequencies is determined on the basis of the switching frequency $f_{sw}$ as follows, if the allowable thermal currents are $I_{sw1}$, $I_{sw2}$ and $I_{sw3}$ which correspond to the switching frequencies $f_{sw1}$, $f_{sw2}$ and $f_{sw3}$ at the temperature $T_{sink}$ $$\text{if } f_{sw} < f_{sw1} : I_{f_{out,hi}} = I_{sw1} \tag{14}$$

$$\text{if } f_{sw1} < f_{sw} \leq f_{sw2} : I_{f_{out,hi}} = I_{sw1} + (I_{sw2} - I_{sw1}) \cdot \frac{f_{sw} - f_{sw1}}{f_{sw2} - f_{sw1}} \tag{15}$$

$$\text{if } f_{sw} > f_{sw2} : I_{f_{out,hi}} = I_{sw2} + (I_{sw3} - I_{sw2}) \cdot \frac{f_{sw} - f_{sw2}}{f_{sw3} - f_{sw2}}. \tag{16}$$

Similarly the extrapolation in block 5 of FIG. 3 can be left out at low switching frequencies.

According to another exemplary embodiment of the disclosure, the switching frequency used in the method may be the actual switching frequency or its estimate or its reference value.

In the disclosed method, the beforehand determined data points are used for determining the allowable thermal current at any given operation point differing from the determined data points. In the specification this is explained using simple linear interpolation. It is however clear that a curve which represents a current as a function of temperature, such as in FIG. 1, can be reconstructed from determined data points in various ways. The curves can be drawn for example by using higher-degree interpolation polynomes or splines. As already mentioned, the curves are for illustration purposes. The determined data points are the basis of an interpolation method with which the value of the function can be calculated at a given operation point.

In the specification the method is applied to a frequency converter feeding a load, such as a motor. However, the method can also be applied to a frequency converter that acts as a supply bridge.

The disclosed method can be implemented with a frequency converter as disclosed. An exemplary frequency converter comprises means for storing beforehand two or more data points $I_{sw1,T_{sink1}}$, $I_{sw1,T_{sink2}}$, $I_{sw1,T_{sink3}}$, which define a thermal current limit for a semiconductor component of the frequency converter at specific temperatures $T_{sink1}$, $T_{sink2}$, $T_{sink3}$ at two or more switching frequencies $f_{sw1}$, $f_{sw2}$, $f_{sw3}$, and means for storing beforehand two or more data points $I_{f_{out,0}, T_{sink1}}$, $I_{f_{out,0}, T_{sink2}}$, $I_{f_{out,0}, T_{sink3}}$ which define the thermal current limit for the semiconductor component at specific temperatures $T_{sink1}$, $T_{sink2}$, $T_{sink3}$ at a zero converter output frequency. The means for storing comprise a memory, which is adapted to store data points.

The frequency converter further comprises means for measuring a temperature $T_{sink}$ of the semiconductor component. These means are preferably a temperature sensor, which is adapted to measure the temperature of the semiconductor component or of the heat sink attached to it.

Further, the frequency converter of the disclosure comprises means for determining a switching frequency $f_{sw}$ of the frequency converter. These means can be incorporated into the control circuitry in a similar manner as the means for determining the output frequency $f_{out}$ of the frequency converter.

The frequency converter of the present disclosure also comprises means for determining a highest allowable thermal current $I_{th}$ as a function of the measured temperature $T_{sink}$, determined switching frequency $f_{sw}$ and determined output frequency $f_{out}$ on the basis of the defined data points. These means are also included in the control circuitry which has processing capacity. The control circuitry is also responsible for carrying out other calculations relating to the control of the frequency converter.

Further, the frequency converter of the present disclosure comprises means for limiting the output current of the frequency converter to the determined highest allowable thermal current $I_{th}$. These means are also formed of the control circuitry. It is clear that the above means can also be formed in different ways. The means are connected to each other so that the stored data points in the memory can be read by the control circuitry, which processes the information in the required manner. The control circuitry further limits the output current by feeding the calculated thermal current limit value to the current controller.

In the following the functioning of the method of the disclosure is explained as a practical example. This example is presented so as to better understand the method, and it is not to be taken as limiting the invention. In this example the method is structured as in FIG. 2 and the calculations are carried out using linear interpolation.

The parameters given below are provided as an example.

| | | |
|---|---|---|
| $f_{sw1}$ = 4 kHz | $T_{sink1}$ = 40° C. | |
| $f_{sw2}$ = 8 kHz | $T_{sink2}$ = 70° C. | |
| $f_{sw3}$ = 16 kHz | $T_{sink3}$ = 100° C. | |
| $I_{sw1, T_{sink1}}$ = 96.2 A | $I_{sw2, T_{sink1}}$ = 83.6 A | $I_{sw3, T_{sink1}}$ = 64.7 A |
| $I_{sw1, T_{sink2}}$ = 72.0 A | $I_{sw2, T_{sink2}}$ = 60.9 A | $I_{sw3, T_{sink2}}$ = 45.2 A |
| $I_{sw1, T_{sink3}}$ = 40.9 A | $I_{sw2, T_{sink3}}$ = 32.8 A | $I_{sw3, T_{sink3}}$ = 22.6 A |
| $I_{f_{out}, 0, T_{sink1}}$ = 60.8 A | | |
| $I_{f_{out}, 0, T_{sink2}}$ = 45.1 A | | |
| $I_{f_{out}, 0, T_{sink3}}$ = 25.2 A | | |
| $f_{out, lim}$ = 5 Hz | | |

Figure 6:
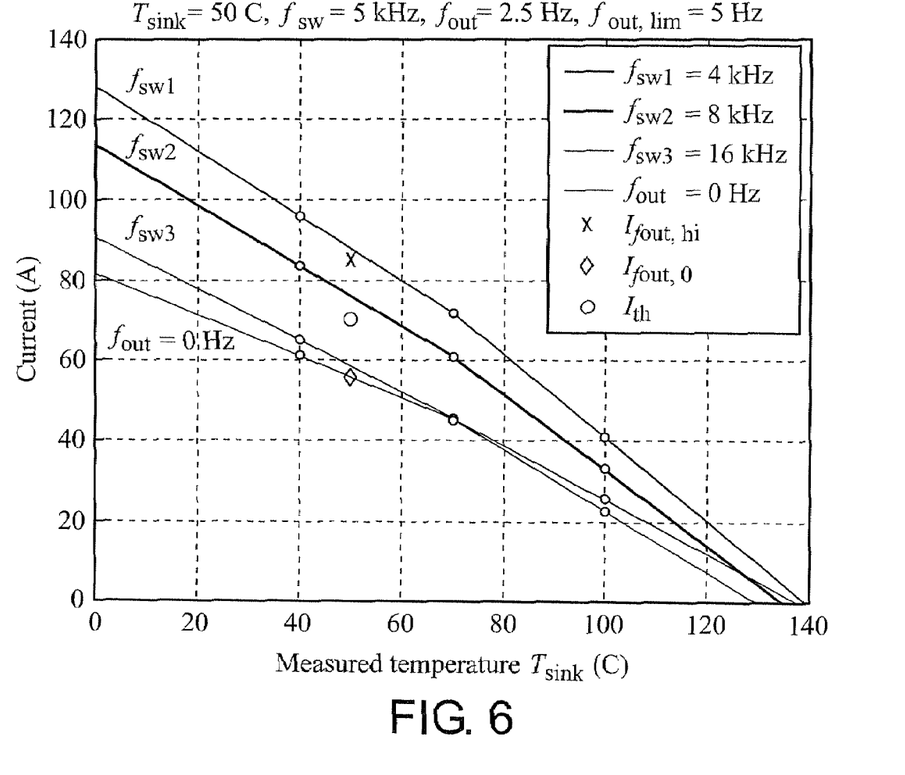
FIG. 6 shows a specific example of the thermal current limits with collected data points.

FIG. 6 shows a situation, where the measured heat sink or module temperature is $T_{sink}$=50° C., switching frequency is $f_{sw}$=5 kHz and output frequency is $f_{out}$=2.5 Hz. FIG. 6 shows four curves formed according to the collected data points shown above. Three upper curves show current limits as a function of the measured temperature at three different switching frequencies. The lower curve is the zero frequency curve which shows the thermal current limit as a function of measured temperature, when the output frequency is zero.

Blocks 1 and 3 of FIG. 2 receive its inputs, which are the black dots in FIG. 6, i.e. the collected data points. The straight lines connecting the points are the results of linear interpolations as explained earlier. Blocks 1 and 3 also receive the measured temperature $T_{sink}$. Block 1 produces values for three different thermal currents that each represent different switching frequencies. These three thermal current values are calculated according to equations (2) and (3) and can be visually seen in FIG. 6 as an intersection between the $T_{sink}$ value 50° C. and three upper curves.

Block 2 of FIG. 2 receives thermal current values from block 1, and calculates a suitable value from these values based on the switching frequency. The switching frequency in the present example is 5 kHz. Thus, this value falls between $f_{sw1}$ and $f_{sw2}$ (4 kHz and 8 kHz). It is thus clear that the thermal current limit should lie between the current values obtained from these curves. Block 2 carries out interpolation according to equations (4) and (5), and produces the thermal current limit $I_{fout,hi}$ for high output frequencies. This value is shown in FIG. 6 marked with a cross.

Block 3 of FIG. 2 produces the highest allowable thermal current for the zero output frequency. This is done by interpolating collected data as explained above. The highest allowable thermal current at the zero frequency at temperature of 50° C. is shown in FIG. 6 in the zero frequency curve.

The output from block 3 is inputted to block 4, which also receives the frequency limit $f_{out,lim}$, which is in this example set to 5 Hz. Since the output frequency $f_{out}$ (2.5 Hz) is below the frequency limit, the thermal current limit for high output frequencies cannot be used as the highest allowable thermal current.

Block 4 of FIG. 2 calculates the highest allowable thermal current $I_{th}$ according to equations (8) and (9). This current is between the current value $I_{fout,hi}$ for high output frequencies and the zero output frequency current value, and it is interpolated between these values based on the output frequency. The method has determined the highest allowable thermal current to be $I_{th}$=70.3 A which is shown in FIG. 6 marked with "o".

It will be obvious to a person skilled in the art that the inventive concept can be implemented in various ways. The invention and its embodiments are not limited to the examples described above but may vary within the scope of the claims.

The invention claimed is:

1. A method for thermal protection of a frequency converter, which frequency converter comprises means for controlling the output current of the frequency converter, the method comprises the steps of determining beforehand two or more data points ($I_{sw1}$, $T_{sink1}$, $I_{sw1}$, $T_{sink2}$, $I_{sw1}$, $T_{sink3}$) which define a thermal current limit for a semiconductor component of the frequency converter at specific temperatures ($T_{sink1}$, $T_{sink2}$, $T_{sink3}$) at two or more switching frequencies ($f_{sw1}$, $f_{sw2}$, $f_{sw3}$), determining beforehand two or more data points ($I_{fout, 0}$, $T_{sink1}$, $I_{fout, 0}$, $T_{sink2}$, $I_{fout, 0}$, $T_{sink3}$) which define a thermal current limit for the semiconductor component at specific temperatures ($T_{sink1}$, $T_{sink2}$, $T_{sink3}$) at a zero converter output frequency, measuring the temperature ($T_{sink}$) of the semiconductor component or relating to the semiconductor component, determining the switching frequency ($f_{sw}$) of the frequency converter, determining the output frequency ($f_{out}$) of the frequency converter, determining the highest allowable thermal current ($I_{th}$) as a function of the measured temperature ($T_{sink}$), determined switching frequency ($f_{sw}$) and determined output frequency ($f_{out}$) on the basis of the defined data points, and limiting the output current of the frequency converter to the determined highest allowable thermal current ($I_{th}$), wherein the step for determining the highest allowable thermal current ($I_{th}$) comprises the steps of calculating allowable thermal currents ($I_{sw1}$, $I_{sw2}$, $I_{sw3}$) at the two or more switching frequencies ($f_{sw1}$, $f_{sw2}$, $f_{sw3}$) from the data points ($I_{sw1}$, $t_{sink1}$, $I_{sw1}$, $T_{sink2}$, $I_{sw1}$, $T_{sink3}$) on the basis of the measured temperature ($T_{sink}$), defining a limit frequency ($f_{out,lim}$), the output frequencies higher than the limit being considered high output frequencies and the output frequencies lower or equal to the limit being considered low output frequencies, calculating an allowable high-output frequency thermal current ($I_{fout,hi}$) for high output frequencies from the calculated allowable thermal currents ($I_{sw1}$, $I_{sw2}$, $I_{sw3}$) and from the two or more switching frequencies ($f_{sw1}$, $f_{sw2}$, $f_{sw3}$) on the basis of the determined switching frequency ($f_{sw}$), calculating an allowable zero converter output frequency thermal current ($I_{fout, 0}$) for the zero converter output frequency from the data points ($I_{fout, 0}$, $T_{sink1}$, $I_{fout, 0}$, $T_{sink2}$, $I_{, 0, T_{sink3}}$) on the basis of the measured temperature ($T_{sink}$), using the calculated allowable high-output frequency thermal current ($I_{fout,hi}$) for the high output frequencies as the highest allowable thermal current ($I_{th}$), if the determined output frequency is high, calculating the highest allowable thermal current ($I_{th}$) from the calculated allowable high-output frequency thermal current ($I_{fout,hi}$) for the high output frequencies and from the calculated allowable zero converter output frequency thermal current ($I_{fout,0}$) for the zero converter output frequency on the basis of the determined converter output frequency ($f_{out}$) if the output frequency is low.

2. A method according to claim 1, wherein the step for determining beforehand two or more data points ($I_{fout, 0}$, $T_{sink1}$, $I_{fout, 0}$, $T_{sink2}$, $I_{fout, 0}$, $T_{sink3}$) at a zero converter output frequency comprises a step in which two or more data points are determined at specific temperatures by using two or more switching frequencies ($f_{sw1b}$, $f_{sw2b}$, $f_{sw3b}$).

3. A method according to claim 2, wherein the method comprises the further steps of calculating the highest allowable thermal currents ($I_{fout, 0, sw1b}$, $I_{fout, 0, sw2b}$, $I_{fout, 0, sw3b}$) at a zero output frequency at two or more switching frequencies ($f_{sw1b}$, $f_{sw2b}$, $f_{sw3b}$), and calculating the highest allowable thermal current for a zero output frequency from the highest allowable thermal currents ($I_{fout, 0, sw1b}$, $I_{fout, 0, sw2b}$, $I_{fout, 0, sw3b}$) at the zero output frequency and from the two or more switching frequencies ($f_{sw1b}$, $f_{sw2b}$, $f_{sw3b}$) on the basis of the determined switching frequency ($f_{sw}$).

4. A method according to claim 3, wherein the step of calculating allowable thermal currents ($I_{sw1}$, $I_{sw2}$, $I_{sw3}$) on the basis of the measured temperature ($T_{sink}$) comprises a step of interpolating the allowable thermal currents ($I_{sw1}$, $I_{sw2}$, $I_{sw3}$), which correspond to the measured temperature ($T_{sink}$) and switching frequencies ($f_{sw1}$, $f_{sw2}$, $f_{sw3}$).

5. The method according to claim 4, wherein the step of calculating the allowable high-output frequency thermal current ($I_{fout, hi}$) for high output frequencies on the basis of the determined switching frequency ($f_{sw}$) comprises a step of interpolating the allowable high-output frequency thermal current ($I_{fout, hi}$) for high output frequencies, which thermal current corresponds to the determined switching frequency ($f_{sw}$).

6. A method according to claim 3, wherein the step of calculating the allowable high-output frequency thermal current ($I_{fout, hi}$) for high output frequencies on the basis of the determined switching frequency ($f_{sw}$) comprises a step of interpolating the allowable high-output frequency thermal current ($I_{fout, hi}$) for high output frequencies, which thermal current corresponds to the determined switching frequency ($f_{sw}$).

7. The method according to claim 6, wherein the step of calculating the allowable zero converter output frequency thermal current ($I_{fout, 0}$) for the zero converter output frequency on the basis of the measured temperature ($T_{sink}$) comprises a step of interpolating the allowable zero converter output frequency thermal current ($I_{fout, 0}$) for the zero converter output frequency, which thermal current corresponds to measured temperature ($T_{sink}$).

8. A method according to claim 3, wherein the step of calculating the allowable zero output frequency thermal current ($I_{fout, 0}$) for the zero converter output frequency on the basis of the measured temperature ($T_{sink}$) comprises a step of interpolating the allowable zero output frequency thermal current ($I_{fout, 0}$) for the zero converter output frequency, which thermal current corresponds to measured temperature ($T_{sink}$).

9. The method according to claim 8, wherein the step of calculating the highest allowable thermal current ($I_{th}$) on the basis of the determined converter output frequency if the output frequency is low comprises a step of interpolating the highest allowable thermal current ($I_{th}$), which corresponds to the determined converter output frequency ($f_{out}$).

10. A method according to claim 3, wherein the step of calculating the highest allowable thermal current ($I_{th}$) on the basis of the determined converter output frequency if the output frequency is low comprises a step of interpolating the highest allowable thermal current ($I_{th}$), which corresponds to the determined converter output frequency ($f_{out}$).

11. The method according to claim 3, wherein the output frequency is a low-pass filtered value of the actual output frequency ($f_{out}$).

12. A method according to claim 1, wherein the output frequency is a low-pass filtered value of the actual output frequency ($f_{out}$).

13. The method according to claim 12, wherein the method comprises the further steps of
determining if the frequency converter is in the regenerative mode or in the motoring mode,
multiplying the determined highest allowable thermal current ($I_{th}$) with a factor (k), the value of which depends on the determined mode of the frequency converter, and
using the product ($kI_{th}$) as the highest allowable thermal current.

14. A method according to claim 1, wherein the method comprises the further steps of
determining if the frequency converter is in the regenerative mode or in the motoring mode,
multiplying the determined highest allowable thermal current ($I_{th}$) with a factor (k), the value of which depends on the determined mode of the frequency converter, and
using the product ($kI_{th}$) as the highest allowable thermal current.

15. The method according to claim 14, wherein the step of calculating allowable thermal currents ($I_{sw1}$, $I_{sw2}$, $I_{sw3}$) on the basis of the measured temperature ($T_{sink}$) comprises a step of interpolating the allowable thermal currents ($I_{sw1}$, $I_{sw2}$, $I_{sw3}$), which correspond to the measured temperature ($T_{sink}$) and switching frequencies ($f_{sw1}$, $f_{sw2}$, $f_{sw3}$).

* * * * *